(12) United States Patent
Mor et al.

(10) Patent No.: US 10,609,357 B2
(45) Date of Patent: *Mar. 31, 2020

(54) SYNCHRONIZATION OF PROJECTED ILLUMINATION WITH ACTIVATION OF SENSING ELEMENTS (71) Applicant: APPLE INC., Cupertino, CA (US)

(72) Inventors: Zafrir Mor, Ein Habsor (IL); Alexander Shpunt, Portola Valley, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/045,779

(22) Filed: Jul. 26, 2018

(65) Prior Publication Data

US 2019/0068951 A1 Feb. 28, 2019

Related U.S. Application Data (63) Continuation of application No. 15/673,433, filed on Aug. 10, 2017, now Pat. No. 10,063,835, which is a
(Continued)

(51) Int. Cl.
G02B 19/00 (2006.01)
G02B 21/20 (2006.01)
(Continued)

(52) U.S. Cl.
CPC ....... *H04N 13/207* (2018.05); *G02B 19/0028* (2013.01); *G02B 19/0057* (2013.01);
(Continued)

(58) Field of Classification Search
None
See application file for complete search history.

(56) References Cited

U.S. PATENT DOCUMENTS 5,552,893 A   9/1996  Akasu
5,646,928 A   7/1997  Wu et al.
(Continued)

FOREIGN PATENT DOCUMENTS

DE  102011001387 A1  9/2012
EP       2827175 A2   1/2015
(Continued)

OTHER PUBLICATIONS

Charbon et al., "SPAD-Based Sensors", TOF Range-Imaging Cameras, Springer-Verlag Berlin Heidelberg, pp. 11-38, 2013.
(Continued)

*Primary Examiner* — Mark T Monk
(74) *Attorney, Agent, or Firm* — Kligler & Associates Patent Attorneys Ltd (57) ABSTRACT Imaging apparatus includes an illumination assembly, including a plurality of radiation sources and projection optics, which are configured to project radiation from the radiation sources onto different, respective regions of a scene. An imaging assembly includes an image sensor and objective optics configured to form an optical image of the scene on the image sensor, which includes an array of sensor elements arranged in multiple groups, which are triggered by a rolling shutter to capture the radiation from the scene in successive, respective exposure periods from different, respective areas of the scene so as to form an electronic image of the scene. A controller is coupled to actuate the radiation sources sequentially in a pulsed mode so that the illumination assembly illuminates the different, respective areas of the scene in synchronization with the rolling shutter.

18 Claims, 8 Drawing Sheets

Related U.S. Application Data continuation of application No. 13/765,706, filed on Feb. 13, 2013, now Pat. No. 9,736,459, which is a continuation of application No. 12/762,373, filed on Apr. 19, 2010, now abandoned.

(60) Provisional application No. 61/300,465, filed on Feb. 2, 2010.

(51) Int. Cl.
| | | |
|---|---|---|
| *G02B 27/09* | (2006.01) | |
| *H01S 5/00* | (2006.01) | |
| *H01S 5/022* | (2006.01) | |
| *H01S 5/40* | (2006.01) | |
| *H01S 5/42* | (2006.01) | |
| *H04N 13/207* | (2018.01) | |
| *G03B 15/06* | (2006.01) | |
| *H01L 33/60* | (2010.01) | |

(52) U.S. Cl.
CPC ......... *G02B 27/0983* (2013.01); *G03B 15/06* (2013.01); *G02B 27/0944* (2013.01); *G02B 27/0972* (2013.01); *H01L 33/60* (2013.01); *H01S 5/005* (2013.01); *H01S 5/0071* (2013.01); *H01S 5/02248* (2013.01); *H01S 5/4031* (2013.01); *H01S 5/423* (2013.01)

(56) References Cited

U.S. PATENT DOCUMENTS

| | | | |
|---|---|---|---|
| 5,883,746 | A | 3/1999 | Zelenka |
| 6,043,104 | A | 3/2000 | Uchida |
| 6,624,919 | B2 | 9/2003 | Lambert |
| 7,133,022 | B2 | 11/2006 | Grabert |
| 7,544,945 | B2 | 6/2009 | Tan et al. |
| 9,400,177 | B2 | 7/2016 | Pesach |
| 9,553,423 | B2 | 1/2017 | Chen et al. |
| 9,736,459 | B2 | 8/2017 | Mor et al. |
| 9,880,265 | B2 | 1/2018 | Schneider et al. |
| 9,885,778 | B2 | 2/2018 | Dussan |
| 9,997,551 | B2 | 6/2018 | Mandai et al. |
| 10,063,835 | B2 * | 8/2018 | Mor .................. G02B 27/0983 |
| 2005/0178950 | A1 * | 8/2005 | Yoshida ............... H04N 5/2354 250/208.1 |
| 2007/0242254 | A1 | 10/2007 | Nagasaka |
| 2009/0016710 | A1 | 1/2009 | Nozaki et al. |
| 2011/0187878 | A1 | 8/2011 | Mor et al. |
| 2012/0140184 | A1 | 6/2012 | Bruzzone |
| 2013/0182227 | A1 | 7/2013 | Schuck |
| 2015/0077645 | A1 | 3/2015 | Lin |
| 2015/0131080 | A1 | 5/2015 | Retterath et al. |
| 2016/0161752 | A1 | 6/2016 | Negoita et al. |
| 2016/0373704 | A1 | 12/2016 | Akiyama |
| 2017/0052065 | A1 | 2/2017 | Sharma et al. |
| 2017/0146803 | A1 | 5/2017 | Kishigami et al. |
| 2017/0176579 | A1 | 6/2017 | Niclass et al. |
| 2017/0219695 | A1 | 8/2017 | Hall et al. |
| 2017/0242100 | A1 | 8/2017 | Hinokuma et al. |
| 2018/0062345 | A1 | 3/2018 | Bills et al. |
| 2018/0073863 | A1 | 3/2018 | Watanabe |
| 2018/0084241 | A1 | 3/2018 | Chen et al. |
| 2019/0107728 | A1 | 4/2019 | Kim |

FOREIGN PATENT DOCUMENTS

| | | | |
|---|---|---|---|
| WO | 2013062932 | A1 | 5/2013 |
| WO | 2014093085 | A1 | 6/2014 |
| WO | 2015199615 | A1 | 12/2015 |
| WO | 2019125349 | A1 | 6/2019 |

OTHER PUBLICATIONS

International Application # PCT/US2017/066919 search report dated Sep. 27, 2018.
International Application # PCT/US2018/66629 search report dated Apr. 3, 2019.
U.S. Appl. No. 16/544,972 office action dated Oct. 1, 2019.

* cited by examiner

SYNCHRONIZATION OF PROJECTED ILLUMINATION WITH ACTIVATION OF SENSING ELEMENTS

CROSS-REFERENCE TO RELATED APPLICATION APPLICATIONS

This application is a continuation of U.S. patent application Ser. No. 15/673,433 (now U.S. Pat. No. 10,063,835), filed Aug. 10, 2017, which is a continuation of U.S. patent application Ser. No. 13/765,706 (now U.S. Pat. No. 9,736,459), filed Feb. 13, 2013, which is a continuation of U.S. patent application Ser. No. 12/762,373, filed Apr. 19, 2010 (now abandoned), which claims the benefit of U.S. Provisional Patent Application 61/300,465, filed Feb. 2, 2010, which is incorporated herein by reference.

FIELD OF THE INVENTION

The present invention relates generally to systems and methods for electronic imaging, and specifically to methods of illumination for enhancing the quality of captured images.

BACKGROUND OF THE INVENTION

Most low-cost CMOS image sensors use a rolling shutter, in which successive rows of sensor elements are triggered sequentially to capture light. This method of image acquisition thus records each individual frame not as a single snapshot at a point in time, but rather as a sequence of image stripes scanning across the frame. The result of the rolling shutter is that not all parts of the optical image are recorded at exactly the same time (although the frame is stored as a single electronic image).

The use of a rolling shutter introduces a temporal shear in the image frame, which can create artifacts in imaging of moving objects. Bradley et al. address this problem in "Synchronization and Rolling Shutter Compensation for Consumer Video Camera Arrays," *IEEE International Workshop on Projector-Camera Systems—PROCAMS* 2009 (Miami Beach, Fla., 2009), which is incorporated herein by reference. The authors propose to solve the problem using synchronized stroboscopic illumination.

SUMMARY

Embodiments of the present invention that are described hereinbelow provide apparatus and methods for illuminating an object that can be advantageous when the object is imaged using a sensor with a rolling shutter.

There is therefore provided, in accordance with an embodiment of the present invention, imaging apparatus, including an illumination assembly, including a plurality of radiation sources and projection optics, which are configured to project radiation from the radiation sources onto different, respective regions of a scene. An imaging assembly includes an image sensor and objective optics configured to form an optical image of the scene on the image sensor, which includes an array of sensor elements arranged in multiple groups, which are triggered by a rolling shutter to capture the radiation from the scene in successive, respective exposure periods from different, respective areas of the scene so as to form an electronic image of the scene. A controller is coupled to actuate the radiation sources sequentially in a pulsed mode so that the illumination assembly illuminates the different, respective areas of the scene in synchronization with the rolling shutter.

In disclosed embodiments, each group includes one or more rows of the sensor elements, and the regions define stripes that extend across the scene in a direction parallel to the rows. Typically, each stripe illuminates a respective region that contains the areas of the scene from which the sensor elements in a respective set of multiple rows capture the radiation, and the controller is configured to actuate the radiation sources so that the projected radiation sweeps across the scene in a direction perpendicular to the rows.

In a disclosed embodiment, the rolling shutter defines a frame time for capturing the entire electronic image, and the controller is configured to actuate each of the radiation sources for a respective actuation period that is less than half the frame time. The controller may actuate each of the radiation sources so that the illumination assembly illuminates each area of the scene only during a respective exposure period of a corresponding group of the sensor elements that captures the radiation from the area.

In some embodiments, the projection optics include a patterning element, which is configured so that the radiation is projected onto the scene in a predefined pattern, which is detectable in the electronic image formed by the imaging assembly. Typically, the controller is configured to analyze the pattern in the electronic image so as to generate a depth map of the scene. In one embodiment, the radiation sources include a matrix of light-emitting elements, which are arranged on a substrate and are configured to emit the radiation in a direction perpendicular to the substrate. In another embodiment, the radiation sources include a row of edge-emitting elements, which are arranged on a substrate and are configured to emit the radiation in a direction parallel to the substrate, and the illumination assembly includes a reflector disposed on the substrate so as to turn the radiation emitted by the edge-emitting elements away from the substrate and toward the patterning element.

There is also provided, in accordance with an embodiment of the present invention, a method for imaging, including arranging a plurality of radiation sources to project radiation onto different, respective regions of the scene. An image sensor, which includes an array of sensor elements arranged in multiple groups, is configured to receive an optical image of the scene, in which the groups of the sensor elements receive the radiation from different, respective areas of the scene. The groups of the sensor elements are triggered with a rolling shutter to capture the radiation from the scene in successive, respective exposure periods so as to form an electronic image of the scene. The radiation sources are actuated sequentially in a pulsed mode so as to illuminate the different, respective areas of the scene in synchronization with the rolling shutter.

In one embodiment, configuring the image sensor includes arranging multiple image sensors, having respective rolling shutters, together with multiple, respective pluralities of the radiation sources to form respective electronic images of different, respective, overlapping parts of a scene, and actuating the radiation sources includes synchronizing the respective pluralities of the radiation sources over the multiple image sensors so as to control an overlap of the respective areas of the scene illuminated by the radiation sources at any given time. The method may include analyzing the pattern over the electronic images formed by the multiple image sensors in order to generate a depth map of the scene.

There is additionally provided, in accordance with an embodiment of the present invention, imaging apparatus, including multiple imaging units. The imaging units include respective pluralities of radiation sources and projection optics, which are configured to project radiation from the radiation sources onto different, respective regions of a scene, and respective imaging assemblies. The imaging assemblies include respective image sensors and objective optics configured to form respective optical images of different, respective, overlapping parts of the scene on the respective image sensors. Each image sensor includes an array of sensor elements arranged in multiple groups, which are triggered by a rolling shutter to capture the radiation from the scene in successive, respective exposure periods from different, respective areas of the scene so as to form respective electronic images of the scene. The radiation sources are actuated sequentially in a pulsed mode so that the illumination assembly illuminates the different, respective areas of the scene in synchronization with the rolling shutter, while synchronizing the respective pluralities of the radiation sources over the multiple image sensors so as to control an overlap of the respective areas of the scene illuminated by the radiation sources at any given time.

Typically, the overlap is controlled so that the respective areas of the scene illuminated by the radiation sources at any given time are non-overlapping.

The present invention will be more fully understood from the following detailed description of the embodiments thereof, taken together with the drawings in which:

DETAILED DESCRIPTION OF EMBODIMENTS

Overview

Various types of imaging systems include optical projectors for illuminating the scene of interest. For example, a projector may be used to cast a pattern of coded or structured light onto an object for purposes of three-dimensional (3D) depth mapping. In this regard, U.S. Patent Application Publication 2008/0240502, whose disclosure is incorporated herein by reference, describes an illumination assembly in which a light source, such as a laser diode or LED, transilluminates a transparency with optical radiation so as to project a pattern onto the object. (The terms "optical," "light" and "illumination" as used herein refer generally to any of visible, infrared, and ultraviolet radiation.) An image sensor captures an image of the pattern that is projected onto the object, and a processor processes the image so as to reconstruct a three-dimensional (3D) map of the object.

Systems based on projection of patterned light may suffer from low signal/background ratio due to limitations on the power of the projector, particularly in conditions of strong ambient light. Embodiments of the present invention address this problem by projecting radiation onto the scene of interest in a synchronized spatial sweep, which is timed to take advantage of the rolling shutter of the image sensor in order to improve the signal/background ratio of the system.

In embodiments of the present invention, the rolling shutter is operated so as to cause different groups (typically successive rows) of sensor elements in the image sensor to capture radiation in different, successive exposure periods, which are much shorter than the total frame period (typically less than half, and possibly less than 10%). Each such group collects radiation from a different, respective area of the scene, which is focused onto the image sensor by objective optics. The illumination assembly is controlled so as to sweep the projected radiation over those areas of the scene in synchronization with the rolling shutter, so that each area of the scene is illuminated during the specific time that the corresponding group of sensor elements is active. As a result, the output power of the illumination assembly is concentrated, in each area of the scene, in the specific exposure periods during which the corresponding sensor elements are able to collect radiation from that area. Limitation of the exposure periods by the rolling shutter reduces the total amount of ambient radiation that is collected, without wasting any of the projected radiation. Therefore, the signal/background ratio of the system is enhanced substantially even without increasing the average power of the illumination.

In the embodiments that are disclosed hereinbelow, the illumination assembly comprises an array of radiation sources, with projection optics that project radiation from the radiation sources onto different, respective regions of the scene. The spatial sweep of the projected radiation is accomplished by pulsing the radiation sources sequentially. The respective region of the scene that is illuminated by each radiation source overlaps the areas in the scene that are sensed by one or more of the groups of the sensor elements. Each radiation source is thus pulsed on only during the time that the corresponding groups of sensor elements are active. This sequential pulsed operation of the array of radiation sources provides full flexibility in choosing the optimal timing for the spatial sweep of radiation, as well as high reliability in that no moving parts or active optical elements (other than the radiation sources themselves) are required to implement the sweep.

Although the embodiments that are described below relate specifically to projection of patterned light in a 3D sensing system, the principles of the present invention may similarly be applied to enhance the performance of other projection-based imaging systems. The rolling shutter in these embodiments is assumed to activate the sensor elements in the image sensor row by row, as in conventional CMOS image sensors that are known in the art; but the principles of the present invention may similarly be applied in conjunction with image sensors that use other sorts of sequential activation of groups of sensor elements, such as block-by-block activation.

System Description

Figure 1:
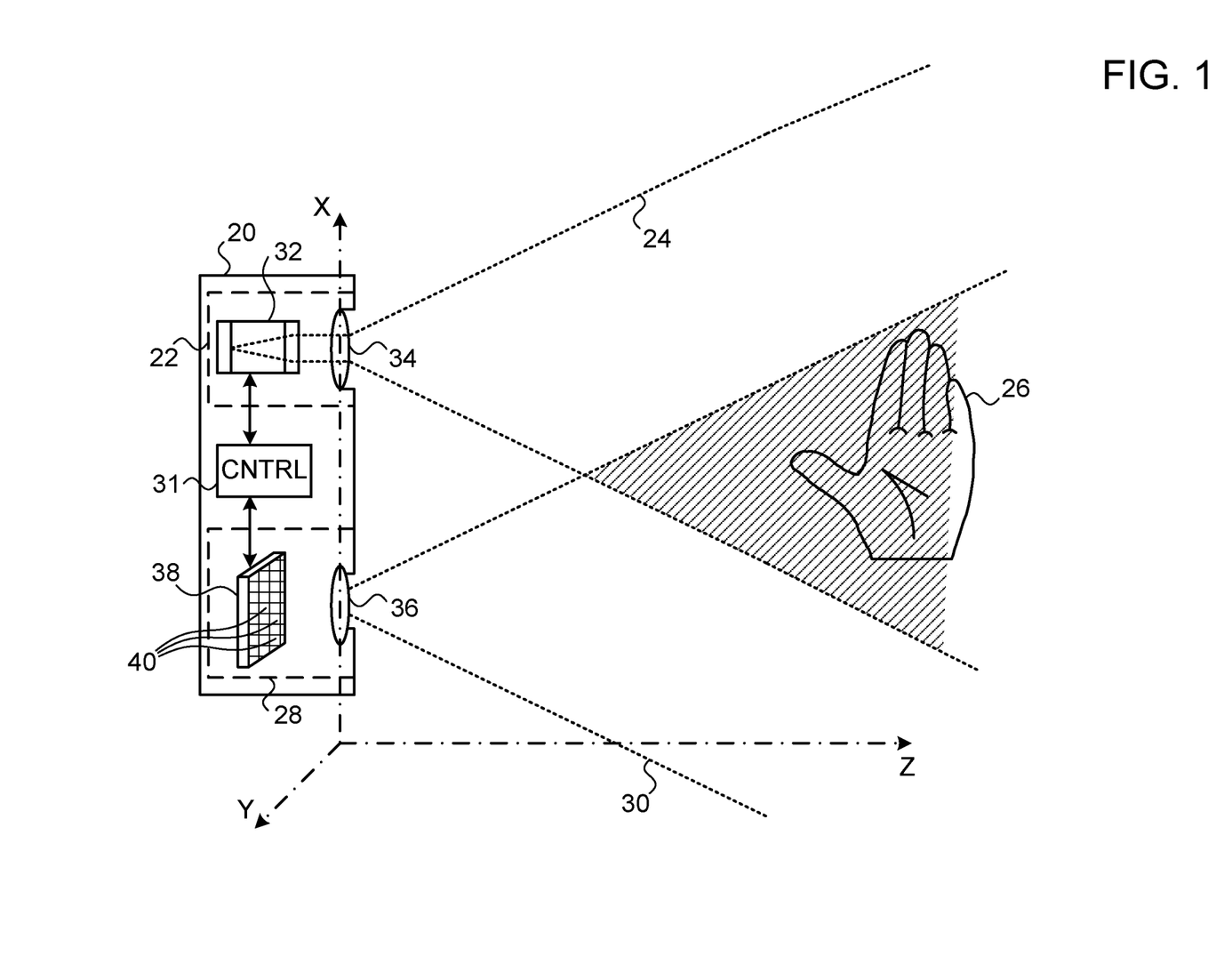
FIG. 1 is a schematic side view of an imaging system, in accordance with an embodiment of the present invention.

FIG. 1 is a schematic side view of an imaging system 20, in accordance with an embodiment of the present invention. A set of X-Y-Z axes is used in this figure and throughout the description that follows to aid in understanding the orientation of the figures, wherein the X-Y plane is the frontal plane of system 20, and the Z-axis extends perpendicularly from this plane toward the scene. The choice of axes, however, is arbitrary and is made solely for the sake of convenience in describing embodiments of the invention.

An illumination assembly 22 projects a patterned radiation field 24 onto an object 26 (in this case a hand of a user of the system) in a scene. An imaging assembly 28 captures an image of the scene within a field of view 30. A controller 31 or other electronic processor processes the image in order to generate a 3D depth map of object 26. Further details of this sort of mapping process are described, for example, in the above-mentioned US 2008/0240502 and in PCT International Publication WO 2007/105205, whose disclosure is also incorporated herein by reference. The 3D map of the user's hand (and/or other parts of the user's body) may be used in a gesture-based computer interface, but this sort of functionality is beyond the scope of the present patent application.

Imaging assembly 28 comprises objective optics 36, which form an optical image of the scene containing object 26 on an image sensor 38, such as a CMOS integrated circuit image sensor. The image sensor comprises an array of sensor elements 40, arranged in multiple rows. The sensor elements generate respective signals in response to the radiation focused onto them by optics 36, wherein the pixel value of each pixel in the electronic images output by image sensor 38 corresponds to the signal from a respective sensor element 40. The sensor elements are activated and deactivated, row by row, by a rolling shutter, whose timing is set by controller 31. This sort of rolling shutter operation is a standard feature of many CMOS image sensors.

Illumination assembly 22 comprises a projection module 32, which generates a beam of patterned light, and projection optics 34, which project the beam onto field 24. Module 32 typically comprises multiple radiation sources, along with optics for pattern generation. Controller 31 actuates the radiation sources sequentially, in a pulsed mode, in synchronization with the rolling shutter of image sensor 38. The design of module 32 and the synchronization of its operation with the rolling shutter are described in detail hereinbelow.

Figure 2:
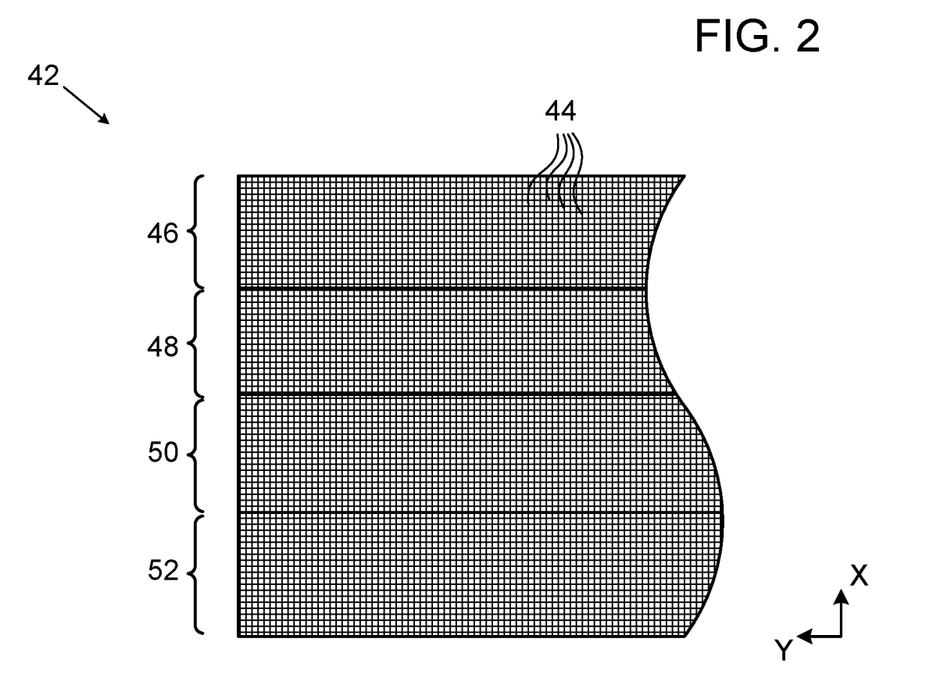
FIG. 2 is a schematic representation of a portion of an image frame captured using stripe illumination, in accordance with an embodiment of the present invention.

FIG. 2 is a schematic representation of a portion of an image frame 42 captured by system 20, in accordance with an embodiment of the present invention. Frame 42 comprises a matrix of pixels 44, each corresponding to the signal generated by a corresponding sensor element 40 in image sensor 38. Thus, each row of pixels 44 corresponds to the area in the scene from which radiation is captured by the corresponding row of sensor elements.

Illumination assembly 22 generates multiple stripes 46, 48, 50, 52, . . . of illumination. Each such stripe is generated by a respective radiation source or group of radiation sources. (Example arrangements of radiation sources that can be used to generate this sort of multi-stripe illumination are shown in the figures that follow.) The region defined by each stripe covers the area of a number of the rows of pixels 44. In other words, each stripe illuminates a certain area of the scene from which the image sensors in the corresponding rows capture radiation. Although stripes 46, 48, 50, 52 are shown in FIG. 2, for the sake of simplicity, as being precisely adjacent to one another and non-overlapping, in practical systems there is generally a certain amount of overlap between the stripes in order to ensure that all areas of the scene are illuminated.

Figure 3:
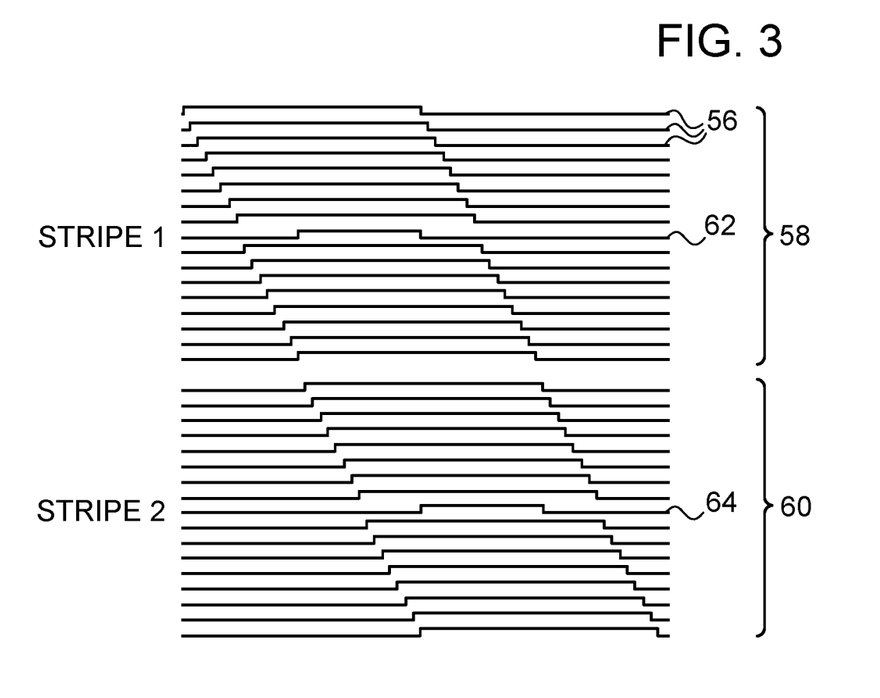
FIG. 3 is a timing diagram showing synchronization of stripe illumination with rolling shutter operation, in accordance with an embodiment of the present invention.

FIG. 3 is a timing diagram illustrating synchronization of the sort of stripe illumination shown in FIG. 2 with the operation of a rolling shutter in image sensor 38, in accordance with an embodiment of the present invention. Traces 56 correspond to the operation of the rolling shutter on successive rows of sensor elements, wherein the elements are active (i.e., convert received photons to electrons in the output signal from the image sensor) when the corresponding trace is high. The period during which a given row is active is referred to herein as the exposure period of that row. The exposure periods of successive rows are staggered, so that each row is activated shortly after the preceding row. The rows are arranged in groups 58, 60, . . . , each group corresponding to the region covered by one of stripes 46, 48, . . . .

Traces 62, 64, . . . correspond to actuation of the respective radiation sources that generate stripes 46, 48, . . . . In other words, when trace 62 is high, the radiation source that generates stripe 46 is actuated, and so on. For each group 58, 60, . . . , of the rows, the actuation period of the corresponding radiation source is set so as to fall entirely within the exposure periods of all the rows in the group. Thus, the illumination assembly illuminates each area of the scene only during the exposure periods of the sensor elements that capture the radiation from the area, and none of the illumination is wasted.

Trace 64 goes high just as trace 62 goes low, and so forth over all the radiation sources in illumination assembly 22. Thus, the stripe output of the illumination assembly sweeps across the scene in a sweep direction perpendicular to the rows of pixels 44 (and sensor elements 40), completing one such sweep in each image frame, in synchronization with the sweep of the rolling shutter of image sensor 38. The duty cycle of each radiation source is roughly 1:N, wherein N is the number of stripes (each illuminated by a respective radiation source or group of radiation sources). In the timing scheme of FIG. 3, the actuation period of each illumination stripe is approximately $1/(N*FR)$, while the exposure period of each row of sensor elements 40 is approximately $2/(N*FR)$, wherein FR is the frame rate, such as 30 frames/sec. These timing relations typically make optimal use of the available illumination power and provide the greatest possible enhancement of signal/background ratio.

Alternatively, other timing relations may be used between the frame rate, actuation periods and exposure times. These alternative timing arrangements may be advantageous in situations in which the geometrical relationships between illumination stripes and sensor rows are not maintained as precisely as in FIG. 2, and particularly when successive stripes partially overlap.

Illumination Module with Edge Emitters

Figure 4A:
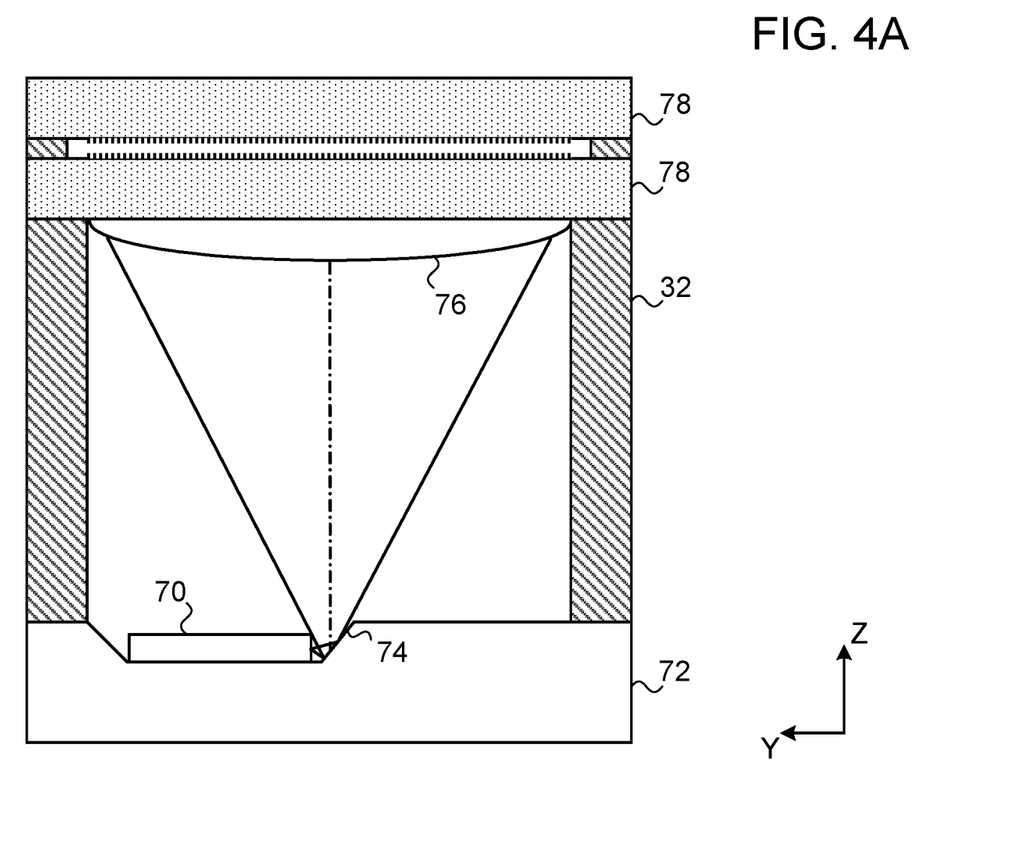
FIG. 4A is a schematic side view of a projection module, in accordance with an embodiment of the present invention.
Figure 4B:
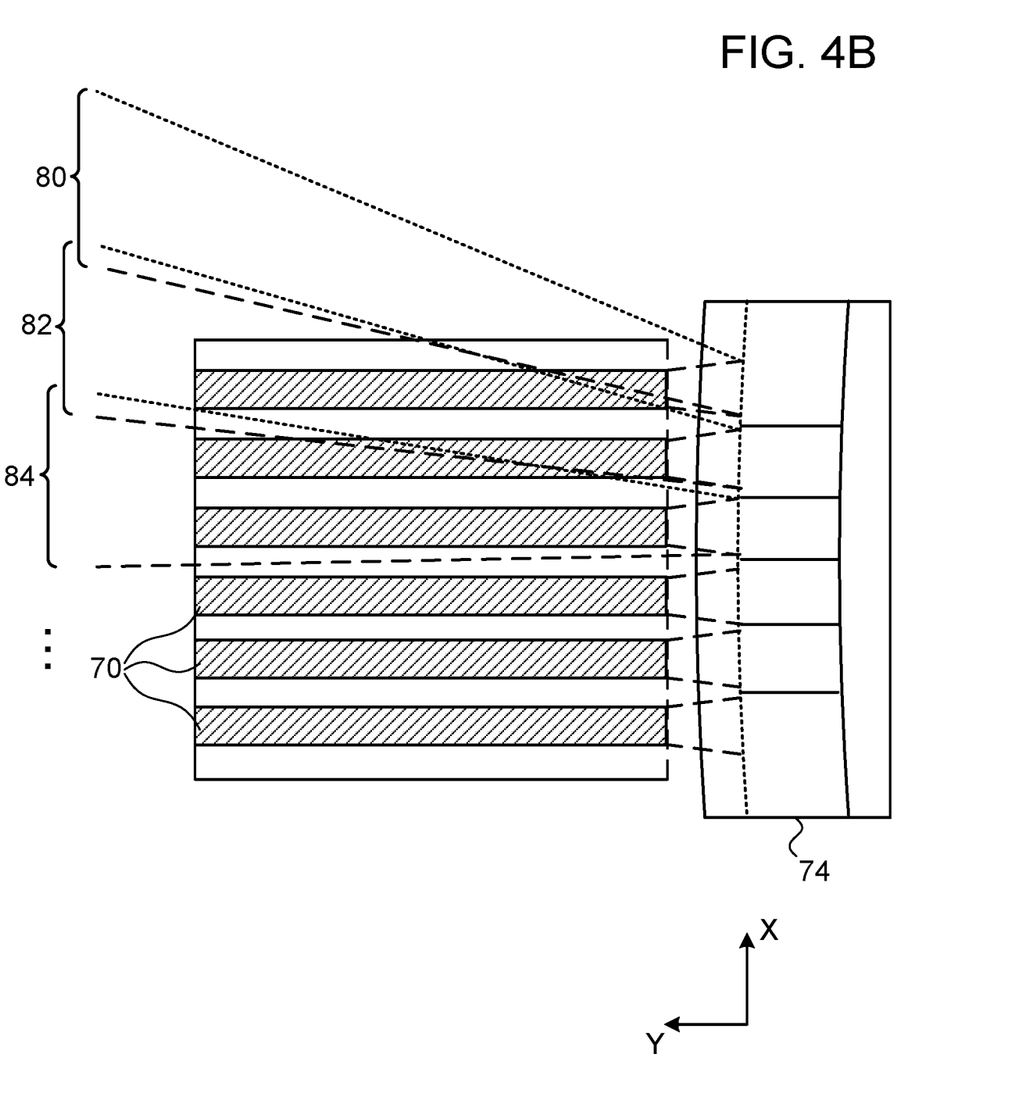
FIG. 4B is a schematic top view of an optoelectronic subassembly used in the projection module of FIG. 4A.

FIG. 4A is a schematic side view of illumination module 32, while FIG. 4B is a schematic top view of an optoelectronic subassembly used in illumination module 32, in accordance with an embodiment of the present invention. Module 32 comprises a row of edge-emitting optoelectronic elements 70, such as laser diodes, which are formed on a substrate 72, such as a silicon wafer. (Only one of the elements can be seen in the side view of FIG. 4A.) Elements 70 emit radiation in a direction parallel to the substrate. A reflector 74 on the substrate turns the radiation emitted by elements 70 away from the substrate, which is oriented in the X-Y plane, toward the Z-axis. The reflector may be integrally formed in substrate 72, as shown in FIG. 4A, or it may alternatively comprise a separate element, which is positioned on the substrate and aligned with optoelectronic elements 70. Reflector 74 may simply comprise a flat reflecting surface, or it may alternatively comprise one or more curved surfaces or multiple flat surfaces in order to spread or focus the radiation, as illustrated in FIG. 4B, as well as FIG. 5C.

A collecting lens 76 collimates and directs the radiation from optoelectronic elements 70 through one or more patterning elements 78. The patterning elements cause the radiation from elements 70 to be projected onto the scene in a predefined pattern, which is detectable in the electronic image formed by imaging assembly 28. This pattern in the image is processed in order to compute the depth map of the scene. Patterning elements 78 may comprise a patterned transparency, which may comprise a micro-lens array (MLA), as described, for example, in the above-mentioned US 2008/0240502 or WO 2007/105205, and/or one or more diffractive optical elements (DOEs), as described in U.S. Patent Application Publication 2009/0185274, whose disclosure is also incorporated herein by reference. Additionally or alternatively, when elements 70 emit coherent radiation, patterning elements 78 may comprise a diffuser, which casts a laser speckle pattern on the scene.

Each of optoelectronic elements 70 emits radiation that forms a respective stripe 80, 82, 84, . . . , as shown in FIG. 4B. (Although the figure shows six such elements and respective stripes, a larger or smaller number of elements and stripes may be used, depending on application requirements.) Reflector 74 may be slightly curved, as shown in the figure, so that the stripes spread over a wider area and overlap the adjacent stripes at their edges. As explained above, controller 31 (FIG. 1) activates elements 70 to emit radiation sequentially, in synchronization with the rolling shutter of image sensor 38, during each image frame captured by imaging assembly 28. Thus, each region of the scene is illuminated during the exposure periods of the corresponding rows of sensor elements 40.

In embodiments in which patterning elements 78 comprise a MLA or other transparency, each stripe 80, 82, 84, . . . , passes through a different, respective region of the transparency, and thus creates a respective part of the overall illumination pattern corresponding to the pattern embedded in the transparency. Projection optics 34 projects this pattern onto the object.

On the other hand, in embodiments in which patterning elements 78 comprise a DOE, either lens 76 or one of elements 78 (or the geometry of optoelectronic elements 70) is typically configured to create an appropriate "carrier" angle for the beam emitted by each of the optoelectronic elements. In such embodiments, the beams emitted by the different optoelectronic elements use different parts of lens 76, which may therefore be designed so that the collimated beams exit at respective angles corresponding to the desired vertical fan-out. Alternatively, the illumination module may comprise some other type of optics, such as a blazed grating with as many different zones as there are optoelectronic elements.

Further details of the fabrication of illumination module 32, as well as other, similar sorts of modules, are described in the above-mentioned U.S. Provisional Patent Application 61/300,465.

Figure 5A:
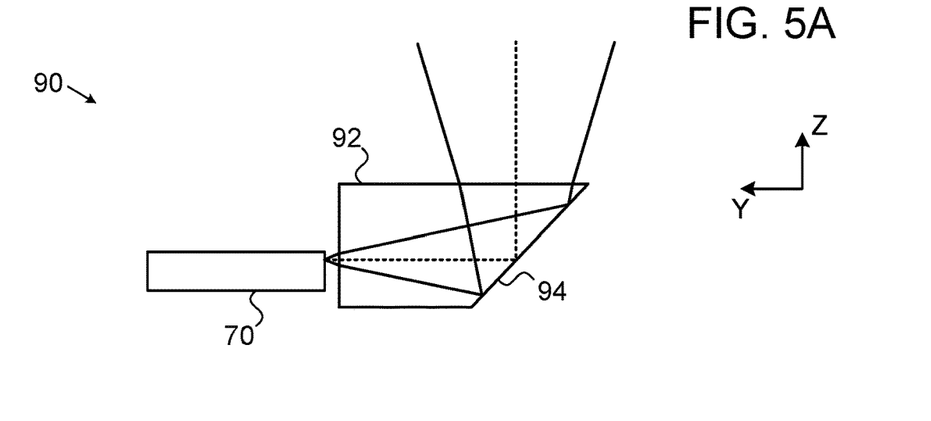
FIGS. 5A and 5B are schematic side and top views, respectively, of an optoelectronic subassembly, in accordance with another embodiment of the present invention.
Figure 5B:
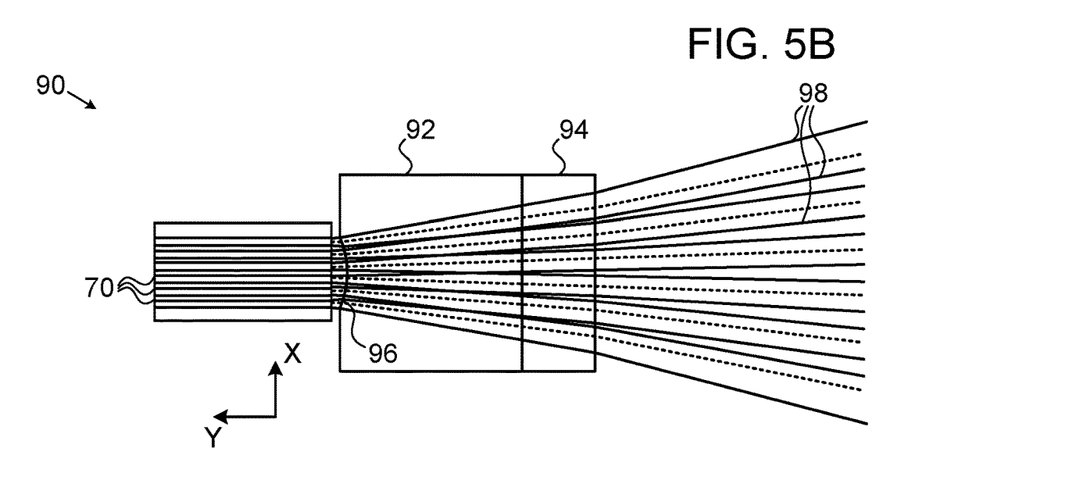
Figure 5C:
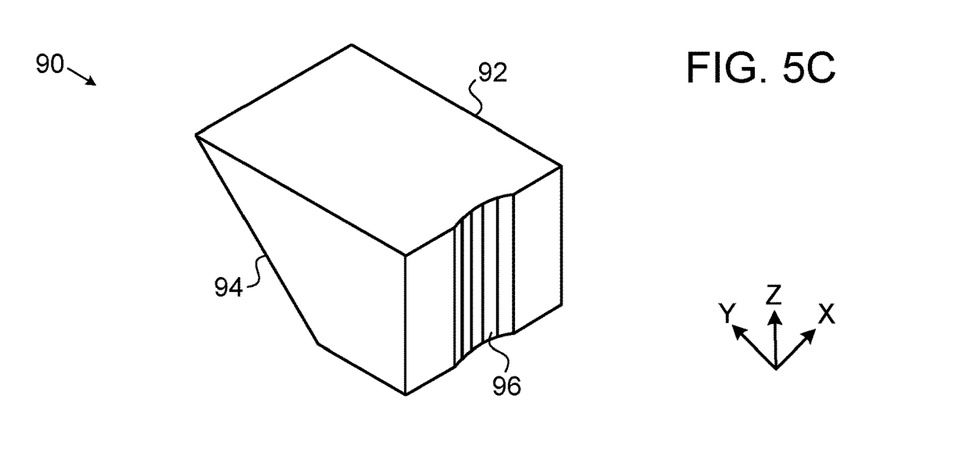
FIG. 5C is a schematic pictorial view of a prism used in the subassembly of FIGS. 5A and 5B.

FIGS. 5A and 5B are schematic side and top views, respectively, of an optoelectronic subassembly 90, while FIG. 5C is a schematic pictorial view of a prism 92 used in subassembly 90, in accordance with another embodiment of the present invention. Subassembly 90 may be used in place of the corresponding components in module 32.

Optoelectronic subassembly 90 comprises a row of edge-emitting optoelectronic elements 70, such as laser diodes, which may be fabricated on a suitable substrate as in the preceding embodiment. In subassembly 90, however, the radiation emitted by elements 70 is reflected internally from an interior surface 94 (typically with a suitable reflective coating) of prism 92. The radiation from elements 70 enters prism 92 via a curved entry surface 96. As a result, respective beams generated by elements 70 spread apart and overlap partially with the adjacent beams. Controller 31 actuates elements 70 to emit radiation sequentially during each image frame in synchronization with the rolling shutter of image sensor 38

Illumination Module with Surface Emitters

Figure 6:
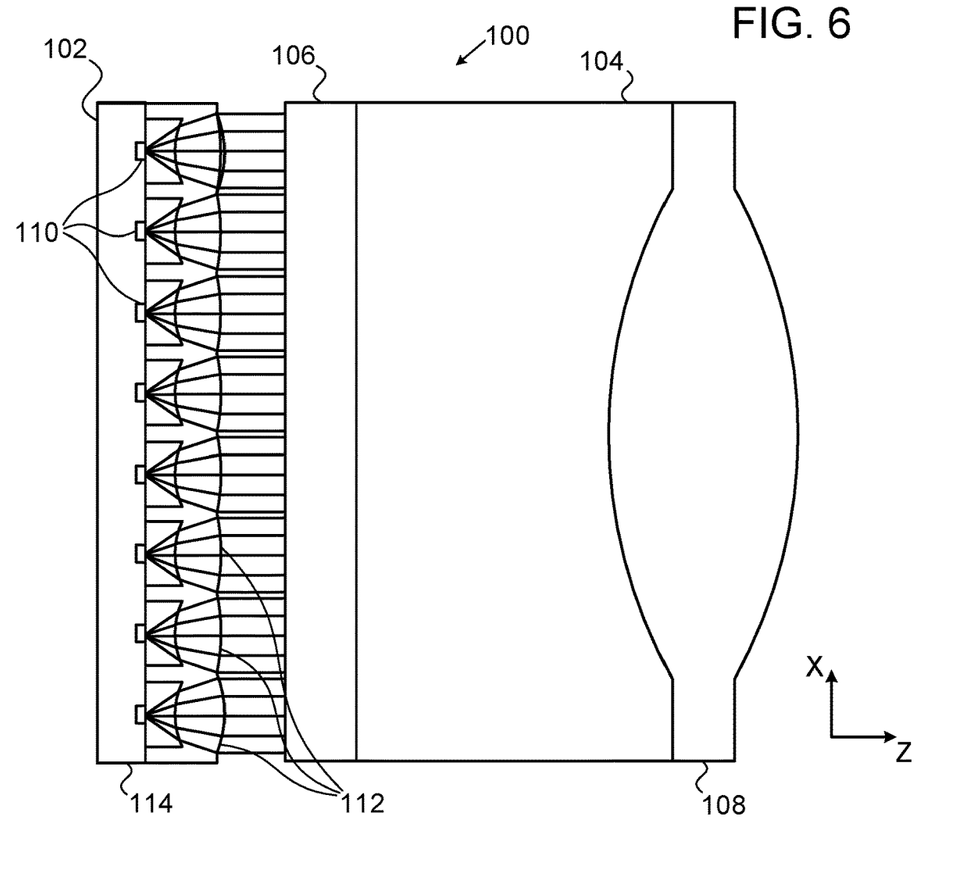
FIG. 6 is a schematic side view of an illumination assembly, in accordance with an alternative embodiment of the present invention.

FIG. 6 is a schematic side view of an illumination assembly 100, in accordance with an alternative embodiment of the present invention. Assembly 100 may be used in system 20 in place of illumination assembly 22. Assembly 100 comprises radiation sources in the form of a two-dimensional matrix of optoelectronic elements 110, which are arranged on a substrate 102 and emit radiation in a direction perpendicular to the substrate. Although FIG. 6 shows only a single row 114 of elements arrayed along the X-axis, assembly 100 actually comprises multiple, parallel rows of this sort, forming a grid in the X-Y plane. FIG. 6 illustrates an 8×8 grid, but larger or smaller matrices, not necessarily square or rectilinear, may alternatively be used.

In contrast to the preceding embodiments, elements 110 comprise surface-emitting devices, such as light-emitting diodes (LEDs) or vertical-cavity surface-emitting laser (VCSEL) diodes, which emit radiation directly into the Z-direction. An array of microlenses (or other suitable micro-optics, such as total internal reflection-based micro-structures) 112 is aligned with elements 110, so that a respective microlens collects the radiation from each element and directs it into an optical module 104. The optical module comprises, inter alia, a suitable patterning element 106, as described above, and a projection lens 108, which projects the resulting pattern onto the scene.

Figure 7:
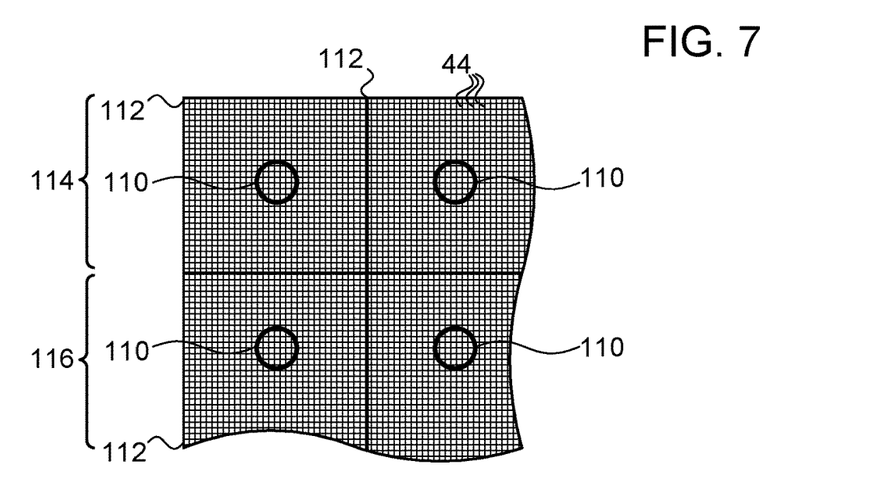
FIG. 7 is a schematic representation of a portion of an image frame illuminated by the illumination assembly of FIG. 6.

FIG. 7 is a schematic representation of a portion of an image frame illuminated by assembly 100, in accordance with an embodiment of the present invention. Each microlens 112 spreads the radiation from the corresponding optoelectronic element 110 over a region of the scene that corresponds to a group of pixels 44. (Typically there is some overlap between neighboring regions, as in the preceding embodiments.) Elements 110 are arranged in multiple rows 114, 116, . . . . In typical operation, controller 31 actuates all the optoelectronic elements in each row in turn in synchronization with the rolling shutter of image sensor 38, in accordance with the scheme shown in FIG. 3, for example. Thus, as described above, the area of each pixel 44 is illuminated during the exposure period of the corresponding sensor element 40.

Although the above embodiments are described, for the sake of clarity, in the context of system 20 and certain specific geometrical configurations of illumination and sensing, the principles of the present invention may similarly be applied in systems and configurations of other sorts.

Synchronization Over Multiple Sensors

Figure 8:
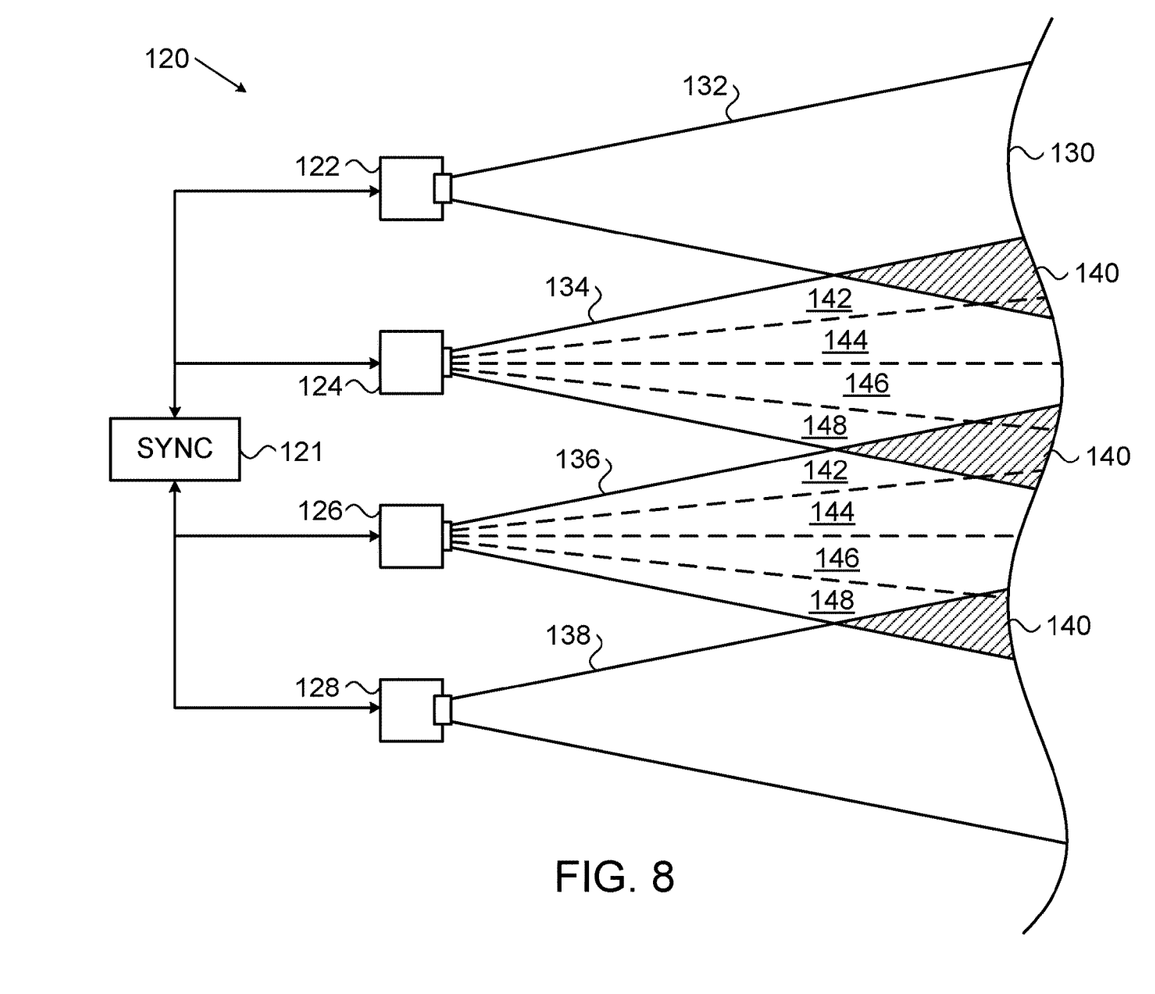
FIG. 8 is a schematic side view of an imaging system, in accordance with another embodiment of the present invention.

FIG. 8 is a schematic side view of an imaging system 120, in accordance with another embodiment of the present invention. In this system, a synchronization controller 121 synchronizes the operation of multiple sensing units 122, 124, 126, 128. Each of these sensing units typically comprises an illumination assembly and an imaging assembly, which operate in concert as in system 20. Each sensing unit 122, 124, 126, 128 projects a respective patterned beam 132, 134, 136, 138 onto a scene 130 and forms a respective image of the part of the scene that is illuminated by the respective pattern.

In order to cover scene 130 completely, the projected patterned beams typically overlap in overlap regions 140. In conventional operation, the overlap of the patterns could lead to inability of sensing units 122, 124, 126, 128 to detect their own patterns reliably in regions 140 and thus to loss of 3D information in these regions. One way to overcome this problem could be to operate the sensing units at different wavelengths, so that each unit senses only its own pattern. This solution, however, can be cumbersome and require costly optoelectronics and optical filters.

Therefore, in system 120, controller 121 controls the timing of the illumination assemblies and the rolling shutters of the imaging assemblies in sensing units 122, 124, 126, 128 so as to control the overlap between the regions that are illuminated at any given time. Typically, the sensing units are controlled so that they illuminate and capture radiation from respective non-overlapping stripes 142, 144, 146, 148. Within each sensing unit, the illumination stripe and the sensing area that is triggered to receive radiation by the rolling shutter are internally synchronized as described above. Furthermore, the timing of all the sensing units is coordinated to avoid interference. Thus, for example, all of the sensing units simultaneously activate their respective stripes 142, followed by stripes 144, and so on, so that no more than a single sensing unit is active within each overlap region 140 at any given time. Each sensing unit provides 3D mapping data with respect to its own part of scene 130, and a processing unit (such as controller 121 or another computer) stitches the data together into a combined depth map.

The scheme illustrated in FIG. 8 is just one example of a possible synchronization pattern, and alternative geometrical and timing patterns may also be implemented to achieve similar objectives. For example, the synchronized sensing units may be arranged in a two-dimensional array in order to cover a wider area of scene 130. Depending on the geometrical arrangement and the timing of the sensing units, systems of multiple synchronized sensing units may be used to capture depth information over greater areas of substantially any desired size and profile, or, alternatively or additionally, with greater speed.

Alternatively, sensing units 122, 124, 126, 128 may operate together without a centralized controller to regulate synchronization. For example, each sensing unit may adjust its own timing so as to maximize its depth readings. Thus, the entire system will converge to an optimal synchronization. Additionally or alternatively, the sensing units may communicate with one another using a token ring type protocol, without centralized control.

Figure 9:
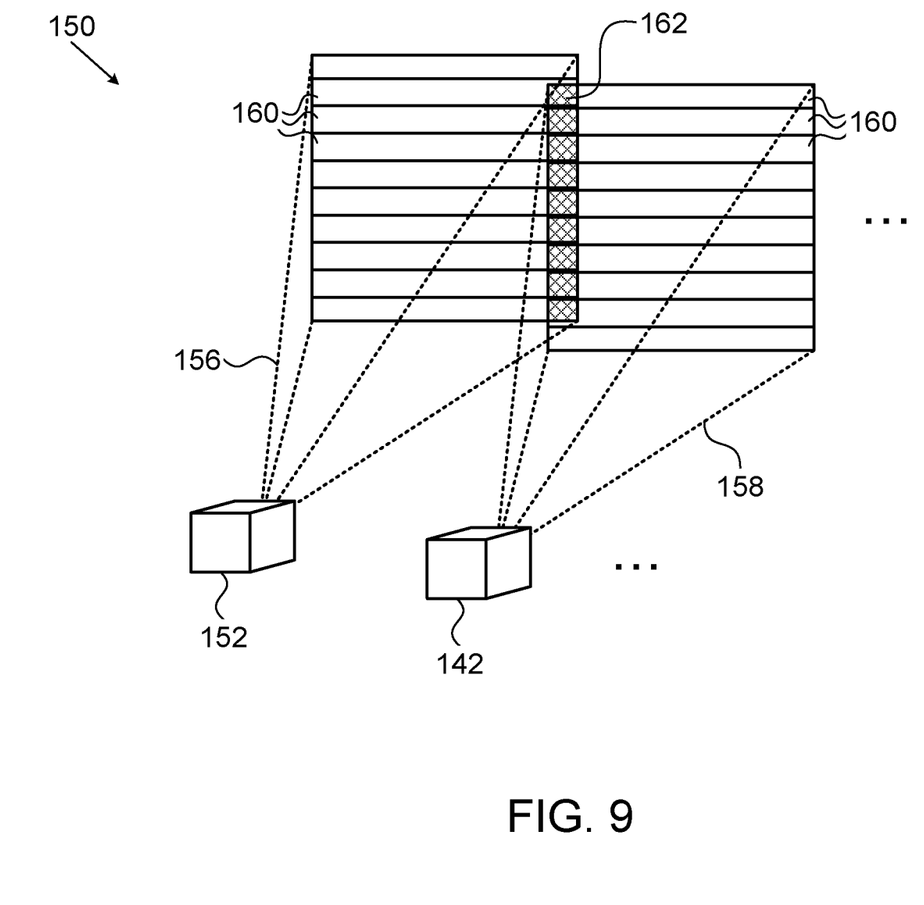
FIG. 9 is a schematic pictorial view of an imaging system, in accordance with yet another embodiment of the present invention.

FIG. 9 is a schematic pictorial view of an imaging system 150, in accordance with yet another embodiment of the present invention. This embodiment is similar in its principles of operation to the embodiment of FIG. 8: Multiple sensing units 152, 154, . . . , project respective patterned beams 156, 158, . . . , onto a scene, while controlling the timing of their respective illumination assemblies and rolling shutters so as to illuminate and capture radiation from respective sequences of stripes 160. Beams 156 and 158 overlap in an overlap region 162. Although for the sake of simplicity, only two sensing units are shown in FIG. 9, any suitable number of sensing units may be arranged in this matter.

In system 150, however, sensing units 152 and 154 and their beams 156 and 158 are offset from one another in a direction perpendicular to the scan direction of the illumination and rolling shutter (horizontal offset with vertical scan in the view shown in FIG. 9), as opposed to the parallel offset shown in FIG. 8. Therefore, most or all of stripes 160 may overlap with certain stripes of the neighboring sensing unit. The scans of sensing units 152, 154, . . . , are therefore synchronized so that each stripe is illuminated in different time periods from its overlapping neighbors. As shown in FIG. 9, there is no need for precise overlap between stripes 160 of the different sensing units, nor do the stripes need to be exactly parallel. Generally speaking, the sensing units may be arranged in any desired arrangement, as long as the synchronization schedule can make overlapping stripes disjoint in time.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Optical apparatus, comprising:
   an illumination assembly, comprising a plurality of radiation sources, mounted on a substrate and configured to emit pulses of optical radiation;
   projection optics, which are configured to project the optical radiation from the radiation sources onto different, respective regions of a scene;
   an imaging assembly, comprising an array of sensor elements and objective optics configured to form an optical image of the scene on the array, so that each of the respective regions of the scene is imaged onto a different, respective group of the sensor elements; and
   a controller, which is coupled to actuate the radiation sources sequentially, so as to sweep the pulses of optical radiation across the scene, to activate the sensor elements to capture the optical radiation reflected from the respective regions of the scene in synchronization with actuation of the radiation sources, and to analyze signals output by the sensor elements in response to the captured optical radiation so as to generate a depth map of the scene.

2. The apparatus according to claim 1, wherein the projection optics comprise an array of micro-optics, which are respectively aligned with the radiation sources.

3. The apparatus according to claim 1, wherein the radiation sources comprise a matrix of light-emitting elements, which are arranged on the substrate and are configured to emit the optical radiation in a direction perpendicular to the substrate.

4. The apparatus according to claim 1, wherein the radiation sources comprise a row of edge-emitting elements, which are arranged on the substrate and are configured to emit the optical radiation in a direction parallel to the substrate.

5. The apparatus according to claim 4, wherein the projection optics comprise a reflector disposed on the substrate so as to turn the optical radiation emitted by the edge-emitting elements away from the substrate and toward the scene.

6. The apparatus according to claim 5, wherein the reflector comprises a prism.

7. The apparatus according to claim 1, wherein each group comprises one or more rows of the sensor elements, and wherein the regions define stripes that extend across the scene in a direction parallel to the rows.

8. The apparatus according to claim 7, wherein the controller is configured to actuate the radiation sources so that the projected radiation sweeps across the scene in a direction perpendicular to the rows.

9. The apparatus according to claim 1, wherein the controller is configured to activate each of the groups of the sensor elements only during a respective exposure period during which a radiation source that illuminates a respective region of the scene is actuated.

10. A method for imaging, comprising:
    directing optical radiation emitted by an array of radiation sources, which are mounted on a substrate, toward projection optics, which are configured to project the optical radiation from the radiation sources onto different, respective regions of a scene;
    actuating the radiation sources sequentially, so as to sweep the pulses of optical radiation across the scene;
    forming an optical image of the scene on an array of sensor elements, so that each of the respective regions of the scene is imaged onto a different, respective group of the sensor elements;
    activating the sensor elements to capture the optical radiation reflected from the respective regions of the scene in synchronization with actuation of the radiation sources; and
    analyzing signals output by the sensor elements in response to the captured optical radiation so as to generate a depth map of the scene.

11. The method according to claim 10, wherein directing the optical radiation comprises aligning an array of micro-optics with the radiation sources so as to direct the optical radiation from the radiation source via the micro-optics toward the scene.

12. The method according to claim 10, wherein the radiation sources comprise a matrix of light-emitting elements, which are arranged on the substrate and are configured to emit the optical radiation in a direction perpendicular to the substrate.

13. The method according to claim 10, wherein the radiation sources comprise a row of edge-emitting elements, which are arranged on the substrate and are configured to emit the optical radiation in a direction parallel to the substrate.

14. The method according to claim 13, wherein directing the optical radiation comprises providing a reflector on the substrate so as to turn the optical radiation emitted by the edge-emitting elements away from the substrate and toward the scene.

15. The apparatus according to claim 14, wherein the reflector comprises a prism.

16. The method according to claim 10, wherein each group comprises one or more rows of the sensor elements, and wherein the regions define stripes that extend across the scene in a direction parallel to the rows.

17. The method according to claim 16, wherein the controller is configured to actuate the radiation sources so that the projected radiation sweeps across the scene in a direction perpendicular to the rows.

18. The apparatus according to claim 10, wherein activating the sensor elements comprises activating each of the groups of the sensor elements only during a respective exposure period during which a radiation source that illuminates a respective region of the scene is actuated.

* * * * *